(12) United States Patent
Sharma et al.

(10) Patent No.: US 11,257,956 B2
(45) Date of Patent: Feb. 22, 2022

(54) THIN FILM TRANSISTOR WITH SELECTIVELY DOPED OXIDE THIN FILM

(71) Applicant: Intel Corporation, Santa Clara, CA (US)

(72) Inventors: Abhishek A. Sharma, Hillsboro, OR (US); Gilbert Dewey, Hillsboro, OR (US); Van Le, Beaverton, OR (US); Jack Kavalieros, Portland, OR (US); Tahir Ghani, Portland, OR (US)

(73) Assignee: Intel Corporation, Santa Clara, CA (US)

(*) Notice: Subject to any disclaimer, the term of this patent is extended or adjusted under 35 U.S.C. 154(b) by 818 days.

(21) Appl. No.: 15/942,175

(22) Filed: Mar. 30, 2018

(65) Prior Publication Data
US 2019/0305133 A1 Oct. 3, 2019

(51) Int. Cl.
H01L 29/786 (2006.01)
H01L 29/08 (2006.01)
H01L 21/425 (2006.01)
H01L 29/66 (2006.01)
H01L 29/423 (2006.01)

(52) U.S. Cl.
CPC ........ *H01L 29/7869* (2013.01); *H01L 21/425* (2013.01); *H01L 29/0847* (2013.01); *H01L 29/42364* (2013.01); *H01L 29/66969* (2013.01)

(58) Field of Classification Search
CPC ............. H01L 29/7869; H01L 29/0847; H01L 21/425; H01L 29/66969; H01L 29/42364; H01L 29/78618
See application file for complete search history.

(56) References Cited

U.S. PATENT DOCUMENTS

| | | | |
|---|---|---|---|
| 5,292,675 A | 3/1994 | Codama | |
| 5,468,987 A | 11/1995 | Yamazaki et al. | |
| 5,717,223 A | 2/1998 | Hack et al. | |
| 5,904,508 A | 5/1999 | Codama et al. | |
| 6,444,390 B1 * | 9/2002 | Yamazaki | H01L 27/12 257/E21.413 |
| 6,518,134 B2 | 2/2003 | Yang et al. | |
| 6,864,504 B2 * | 3/2005 | Breen | H01L 51/0001 257/40 |
| 8,707,131 B2 | 4/2014 | Szapiro et al. | |
| 8,762,543 B2 | 6/2014 | Yao et al. | |
| 8,972,698 B2 | 3/2015 | Hughes et al. | |
| 9,037,840 B2 | 5/2015 | Varma et al. | |
| 9,104,542 B2 | 8/2015 | Szapiro et al. | |
| 9,284,045 B1 | 3/2016 | Springer et al. | |
| 9,448,867 B2 | 9/2016 | Datta et al. | |
| 9,485,628 B2 | 11/2016 | Lee et al. | |

(Continued)

*Primary Examiner* — David Vu
(74) *Attorney, Agent, or Firm* — Essential Patents Group, LLP

(57) ABSTRACT

A thin film transistor (TFT) device is provided, where the TFT may include a source and a drain, a gate stack, and a semiconductor body. The gate stack may include a gate dielectric structure and a gate electrode, and the gate stack may be between the source and the drain. A first section of the semiconductor body may be adjacent to at least a section of the gate stack. A spacer may be between the gate stack and the source, where the spacer may be on the semiconductor body, and where a second section of the semiconductor body underneath the spacer may comprise dopants.

18 Claims, 7 Drawing Sheets

(56) References Cited

U.S. PATENT DOCUMENTS

| | | |
|---|---|---|
| 9,503,966 B2 | 11/2016 | Ong et al. |
| 9,524,263 B2 | 12/2016 | Chappell et al. |
| 10,069,014 B2 * | 9/2018 | Yamazaki ............... H01L 29/36 |
| 10,090,415 B1 | 10/2018 | Hekmatshoartabari et al. |
| 2001/0048107 A1 | 12/2001 | Lyu et al. |
| 2002/0033485 A1 | 3/2002 | Morosawa |
| 2002/0121639 A1 | 9/2002 | So et al. |
| 2002/0123201 A1 | 9/2002 | So et al. |
| 2004/0132293 A1 | 7/2004 | Takayama et al. |
| 2005/0258488 A1 | 11/2005 | Chang et al. |
| 2006/0040432 A1 | 2/2006 | Glasse et al. |
| 2006/0071352 A1 | 4/2006 | Glasse et al. |
| 2007/0295976 A1 | 12/2007 | Katou |
| 2008/0049159 A1 | 2/2008 | Tsaur et al. |
| 2008/0067516 A1 | 3/2008 | Caligiore |
| 2009/0244412 A1 | 10/2009 | Tsukagoshi |
| 2009/0283763 A1 | 11/2009 | Park et al. |
| 2010/0051959 A1 | 3/2010 | Moriwaki |
| 2010/0113091 A1 | 5/2010 | Sharma |
| 2010/0155793 A1 | 6/2010 | Do et al. |
| 2011/0145421 A1 | 6/2011 | Yao et al. |
| 2011/0315980 A1 | 12/2011 | Kim |
| 2012/0196572 A1 | 8/2012 | Zellner et al. |
| 2012/0223303 A1 | 9/2012 | Ye |
| 2014/0009421 A1 | 1/2014 | Lee et al. |
| 2014/0122839 A1 | 5/2014 | Wolrich et al. |
| 2015/0365913 A1 | 12/2015 | Aldana |
| 2016/0093652 A1 | 3/2016 | Ikeda et al. |
| 2016/0097731 A1 | 4/2016 | Usagawa |
| 2016/0118425 A1 | 4/2016 | Kurokawa |
| 2016/0343866 A1 | 11/2016 | Koezuka et al. |
| 2016/0343868 A1 | 11/2016 | Koezuka et al. |
| 2017/0162710 A1 | 6/2017 | Shih et al. |
| 2017/0186324 A1 | 6/2017 | Fish et al. |
| 2017/0229584 A1 | 8/2017 | Okada |
| 2017/0294459 A1 | 10/2017 | Lee |
| 2017/0302641 A1 | 10/2017 | Ramatchandirane et al. |
| 2017/0338108 A1 | 11/2017 | Yamazaki et al. |
| 2018/0012739 A1 | 1/2018 | Yamazaki et al. |
| 2018/0012910 A1 | 1/2018 | Yamazaki et al. |
| 2018/0013002 A1 | 1/2018 | Yamazaki et al. |
| 2018/0025905 A1 | 1/2018 | Yamazaki et al. |
| 2018/0082843 A1 | 3/2018 | Isogai |
| 2018/0083142 A1 | 3/2018 | Chi |
| 2018/0122833 A1 | 5/2018 | Lee et al. |
| 2018/0158843 A1 | 6/2018 | Lius et al. |
| 2018/0170242 A1 | 6/2018 | Wang |
| 2018/0190830 A1 | 7/2018 | Ren et al. |
| 2018/0219097 A1 | 8/2018 | Orui |
| 2019/0043963 A1 | 2/2019 | Baars et al. |
| 2019/0214485 A1 | 7/2019 | Wang et al. |
| 2019/0305133 A1 | 10/2019 | Sharma et al. |
| 2019/0326443 A1 | 10/2019 | Suzuki et al. |
| 2019/0355725 A1 | 11/2019 | Le et al. |
| 2020/0335635 A1 | 10/2020 | Sharma et al. |

* cited by examiner

THIN FILM TRANSISTOR WITH SELECTIVELY DOPED OXIDE THIN FILM

BACKGROUND

Thin-film transistors (TFTs) are a class of field-effect transistors (FETs) in which the channel material is a deposited thin film rather than a monocrystalline material. A common application of TFT technology is liquid crystal displays (LCD), but they are also advantageous in other applications as the thin film deposition processes employed in TFT fabrication are relatively low (e.g., below 450° C.). TFTs can be made using a wide variety of semiconductor materials, such as silicon, germanium, silicon-germanium, as well as various oxide semiconductors (a.k.a. semiconducting oxides) including metal oxides like indium gallium zinc oxide (IGZO). It may be useful to reduce a contact resistance of a TFT.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
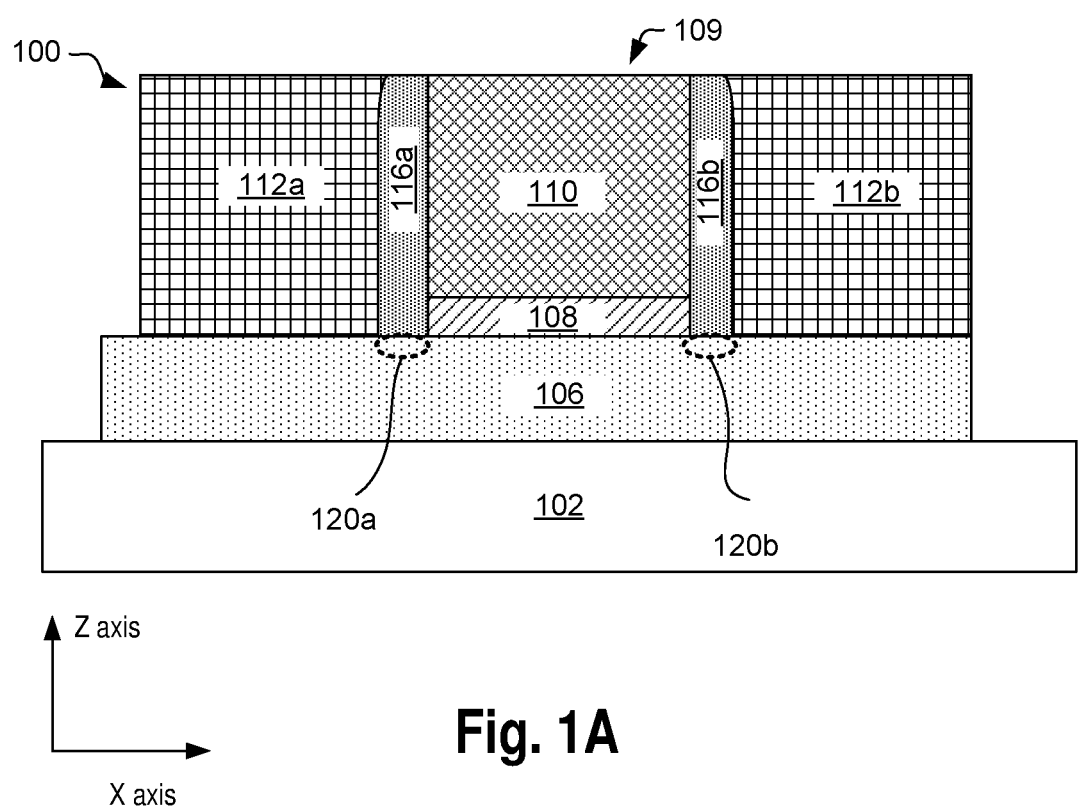
FIG. 1A illustrate a cross-sectional view of a TFT having a thin film that is selectively doped underneath one or more spacers, e.g., to decrease a contact resistance of the TFT, in accordance with some embodiments.

In some embodiments, a TFT may have a top gate, top source/drain contact architecture, where the source/drain contacts and a gate stack may be on a same side of an oxide semiconductor channel. For example, the source/drain contacts and the gate stack may be at least in part coplanar. In such an architecture of the TFT, gate sidewall spacers may be used to isolate the source/drain contacts from a gate electrode of the gate stack. The gate sidewall spacers may be formed on the channel, between the gate stack and the source/drain contacts.

In an example, a section of the channel underneath the spacers may be un-gated and un-doped, which may increase a contact resistance of the TFT. In some embodiments, to overcome such issues, at least a section of the channel underneath the spacers may be doped. For example, the section of the channel may be doped with Arsenic (As), Phosphorus (P), Antimony (Sb), and/or the like. In some embodiments, a section of a channel, which may be at an interface between the spacer and the channel, may be doped. As discussed herein, such dopants may be used to control the contact resistance of the TFT, thereby leading to better performance of the TFT. Other technical effects will be evident from the various embodiments and figures.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single transistor.

It is pointed out that those elements of the figures having the same reference numbers (or names) as the elements of any other figure can operate or function in any manner similar to that described, but are not limited to such.

FIG. 1A illustrate a cross-sectional view of a TFT 100 having a thin film 106 that is selectively doped underneath one or more spacers 116a, 116b, e.g., to decrease a contact resistance of the TFT 100, in accordance with some embodiments. In some embodiments, the TFT 100 may comprise the semiconductor thin film 106 (also referred to as thin film 106) deposited over a substrate layer 102. In some embodiments, the substrate layer 102 is amorphous. Substrate layer 102 may be a dielectric material, such as, but not limited to, silicon dioxide (SiO), a silicon nitride (SiN), silicon oxynitride (SiON), or low-k dielectric (e.g., having a dielectric constant below 3.5).

In some embodiments, the semiconductor thin film 106 (also referred to as a semiconductor body) may have any composition known to be suitable as a TFT channel material, such as a group IV material (e.g., Si, Ge, SiGe, etc.). In some embodiments, the semiconductor thin film 106 is an oxide semiconductor, e.g., a metal oxide semiconductor. In some embodiments, the semiconductor thin film 106 is a large bandgap type of metal oxide. An oxide semiconductor may be a semiconducting oxide. Oxide semiconductors may be advantageous for low temperature transistor fabrication, and may have excellent transistor characteristics offering high carrier mobility and a tunable material band gap and resistivity. Many oxide semiconductors have been studied, initially in the context of discrete rectifiers, and more recently in the context of transparent TFTs for display applications. Examples include metal oxides with a transition metal (e.g., IUPAC group 4-10) or post-transition metal (e.g., IUPAC groups 11-15). In some embodiments, the metal oxide includes at least one of Mg, Cu, Zn, Sn, Ti, Ni, Ga, In, Sb, Sr, Cr, Co, V, or Mo. The metal oxides may be suboxides ($A_2O$), monoxides (AO), binary oxides ($AO_2$), ternary oxides ($ABO_3$), and/or mixtures thereof.

Oxide semiconductor thin film 106 may be a p-type, n-type, or intrinsic material. A number of oxide semiconductors have been found to be capable of significant electron densities. Some oxide semiconductors have also been found to be capable of significant electron hole densities. Many oxide semiconductors have high defect density nearer the valence band, but may display good n-type electrical properties. Some oxide semiconductors have high defect density in the conduction band, but may display good p-type electrical properties. In some embodiments, semiconductor thin film 106 comprises a tin oxide (SnOx), such as Tin (IV) oxide, or $SnO_2$. In other embodiments, the tin oxide is Tin (II) oxide (SnO) or a mixture of SnO and $SnO_2$, where x may range between 1 and 2. While the range of x may be expanded, semiconducting properties may be lost (e.g., the material becomes a pure conductor if x is to low, and a pure insulator if x is too high). In some embodiments, semiconductor thin film 106 comprises a zinc oxide (ZnOx), such as Zn(II) oxide, or ZnO. In some embodiments, the zinc oxide is zinc peroxide (ZnO2) or a mixture of ZnO and ZnO2, where x may range between 1 and 2. In some embodiments, semiconductor thin film 106 comprises titanium oxide (TiOx), or SnOx. Exemplary oxide semiconductors that may have suitable p-type conductivity include copper oxide (CuOx). In some CuOx embodiments, oxide semiconductor thin film 106 is Cu(I) oxide, or $Cu_2O$. In some embodiments, oxide semiconductor thin film 106 is Cu(II) oxide (CuO) or a mixture of CuO and $Cu_2O$, where x may range between 0.5 and 1. In some embodiments, semiconductor thin film 106 compositions include NiOx.

Oxide semiconductor conductivity type is a function of composition. Although not bound by theory, the basis for n-type conductivity in many oxide semiconductors may be the presence of oxygen vacancies. The presence of other electrically active dopants, such as hydrogen, or one or more metal species, may also serve as a means of tuning the semiconducting properties of the oxide semiconductor. Semiconductor oxide thin film 106 may be intentionally doped, or not. Compared to intrinsic oxide semiconductor that is not intentionally doped, n-type and p-type oxide semiconductors may have a higher concentration of impurities, such as, but not limited to, one or more group III element, group V element, and/or elemental hydrogen (H). Dopant levels in oxide semiconductor thin film 106 may be selected to arrive at optimal threshold voltage associated with gating the oxide semiconductor within the channel region and/or for lowest bulk and/or junction resistance within the source and/or drain region. Semiconductor thin film 106 may comprise $ZnO_x$ doped with In and Ga, for example. In some specific embodiments, semiconductor thin film 110 is $InGaO_3(ZnO)_5$, often referred to a simply IGZO.

In some embodiments, at least a section of the semiconductor thin film 106 may be a channel structure or a channel layer of the TFT 100. Accordingly, the semiconductor thin film 106 (or at least a section of the semiconductor thin film 106) may also be referred to herein as a channel structure, channel layer, channel region, channel, a semiconductor body, etc. For example, at least a section of the semiconductor thin film 106 underneath a gate stack 109 may act as a channel region.

In some embodiments, the TFT 100 comprises a gate stack 109, where the gate stack 109 includes gate electrode 110 and gate dielectric 108. In an example, the gate dielectric 108 maybe between the gate electrode 110 and at least a section of the thin film 106.

Depending on the conductivity type of the oxide semiconductor, the gate stack 109 is to modulate the oxide semiconductor of the channel 106 between intrinsic and n-type or p-type material through the field effect. To do so, gate dielectric 108 is to form an interface of suitable quality.

In some embodiments, the gate dielectric 108 comprises a high-k dielectric having a bulk relative dielectric constant greater than at least 9. The gate dielectric 108 may include one or more material layers. In some such embodiments, the high-k gate dielectric includes at least one of $Al_2O_3$, $HfO_2$, or HfAlOx in direct contact with the channel 106. Silicates such as HfSiOx or TaSiOx may also be suitable for either direct contact with the channel 106, or with an underlying interfacial layer of the gate dielectric 108. $HfO_2$ may give better gate control for zinc oxide (e.g., IGZO) embodiments than do alternatives such as $Al_2O_3$. However, both $Al_2O_3$, $HfO_2$ have been found to display results superior to a conventional silicon-based gate dielectric (e.g., $SiO_2$).

One or more material providing a suitable work function may be employed for gate electrode 110. In some embodiments, gate electrode 110 includes a metal with a work function below 5 eV. The metal gate electrode 110 may include an elemental metal layer, a metal alloy layer, or laminate structure of either or both. In some embodiments, the gate electrode 110 is a metal nitride, such as TiN (e.g., 4.0-4.7 eV). The gate electrode may also comprise Al (e.g., TiAlN). Other alloy constituents may also be employed, such as, but not limited to C, Ta, W, Pt, and Zn.

In some embodiments, the TFT 100 further comprises contact metallization, such as source/drain contacts 112a, 112b. For example, the gate stack 109 may be between the source contact 112a and the drain contact 112b.

In some embodiments, the thin film 106 may be substantially compositionally homogeneous. For example, a channel region disposed under the gate stack 109 may have the same oxide semiconductor composition as regions disposed under source/drain contacts 112. As such, the thin film 106 may be coupled to source/drain contacts 112 through semiconductor homojunctions. In alternative embodiments, the thin film 106 is compositionally heterogeneous between the channel region and at least one source/drain region. The TFT channel region is then coupled to source/drain contacts 112 through semiconductor heterojunctions.

Source/drain contacts 112 may have any metal composition that when interfacing the chosen oxide semiconductor of the thin film 106 will, either as deposited, or upon subsequent annealing, have suitable contact resistance. Source/drain contacts 112 may advantageously have a relatively low affinity for oxygen to limit gettering oxygen from the semiconductor thin film 106.

In some embodiments, source/drain contacts 112 include a metal nitride at the interface of (e.g., in direct contact with) the thin film 106. Metal nitrides offer good stability and do not ready oxidize. Exemplary metal nitrides include TiN, TaN, and WN. In other embodiments, source/drain contacts 112 include a noble metal (e.g., Pt) at the interface of (e.g., in direct contact with) the thin film 106.

In some embodiments, the TFT 100 comprises spacer 116a disposed between the gate stack 109 and the source contact 112a, and spacer 116b disposed between the gate stack 109 and the drain contact 112b. An end of each of the spacers 116a, 116b are on the thin film 106 (e.g., in direct contact with the thin film 106). For example, the spacers 116 may be self-aligned gate sidewall spacers that separate source/drain contacts 112 from sidewalls of the gate electrode 110 (e.g., x-dimension separation of 5-20 nm). In some embodiments, each of the spacers 16 has a lateral width (e.g., x-dimension) of 5-20 nm.

In some embodiments, spacers 116 may be of any composition known to have properties suitable as an insulator separating gate electrode 110 from source/drain contacts 112. The spacers 116 may be SiO, SiN, SiON, or any known low-k material (e.g., SiOC, etc.).

The TFT 100 may be an example of a top-side gate architecture (e.g., a top gate TFT), with top side source/drain contacts. For example, as illustrated in FIG. 1A, the source/drain contacts 112a, 112b and the gate stack 109 may be on a same side of the thin film 106. At least a portion of the gate electrode 110, at least a portion of the source contact 112a, and at least a portion of the drain contact 112b may be coplanar.

In some embodiments, at least a section of the thin film 106 may be doped with appropriate dopants. For example, sections 120a, 120b (illustrated symbolically using dotted ovals in FIG. 1A) of the thin film 106 underneath (e.g., directly underneath, as illustrated in the figures) the spacers 116a, 116b, respectively, may be doped with the dopants. In an example, a section of the thin film 106 that is in direct contact with the spacers 116a, 116b may be doped with the dopants. In an example, an interface of the thin film 106 with the spacers 116a, 116b may be doped with the dopants. In an example, an underneath of the spacers 116 may be doped with the dopants, where the underneath of the spacers 116 may face the thin film 106. In some embodiments, although the sections 120 underneath the spacers 116 are doped, sections of the thin film 120 underneath the gate stack 109 (e.g., sections of the thin film 120 in contact with the dielectric layer 108) may remain un-doped (e.g., not doped with the dopants that are used for doping the sections 120).

In some embodiments, merely a top surface of sections of the thin film 106 (e.g., sections that are underneath the spacers 116) may be doped, e.g., without doping an entirety of the sections that are underneath the spacers 116. Thus, the sections 120 may comprise the top surface of the thin film 106 underneath the spacers 116, and a middle section or a bottom section of the thin film 106 underneath the spacers 116 may not be doped.

In some embodiments, the sections 120a, 120b of the thin film 106 may be doped with one or more of Arsenic (As), Phosphorus (P), Antimony (Sb), or the like. For example, As, P, and/or Sb dopants may be used for N type device.

In some embodiments, doping sections 120 of the thin film 106 may involve creating oxygen vacancies in the metal oxide semiconductors of the sections 120 of the thin film 106. Oxygen vacancies in the metal oxide semiconductors may be formed, for example, through defect formation. Defect formation may come from plasma chemistry and/or reduction-like chemistry, such as thin metals gettering oxygen. Any appropriate operations may be performed to dope the sections 120, and/or to create oxygen vacancies in the metal oxide semiconductors of the sections 120.

Without the doping of sections 120 of the thin film 106, the contact resistance (e.g., extrinsic contact resistance Rext) of the TFT 100 may be high due to un-gated and up-doped region of the thin film 106 under the spacers 116, which may degrade the performance of the device 100. In contrast, as sections of the thin film 106 underneath the spacers 116 (e.g., sections of the thin film 120 that are proximal to, or in direct contact with, the spacers 116) are doped, this may reduce the contact resistance of the TFT 100.

Figure 1B:
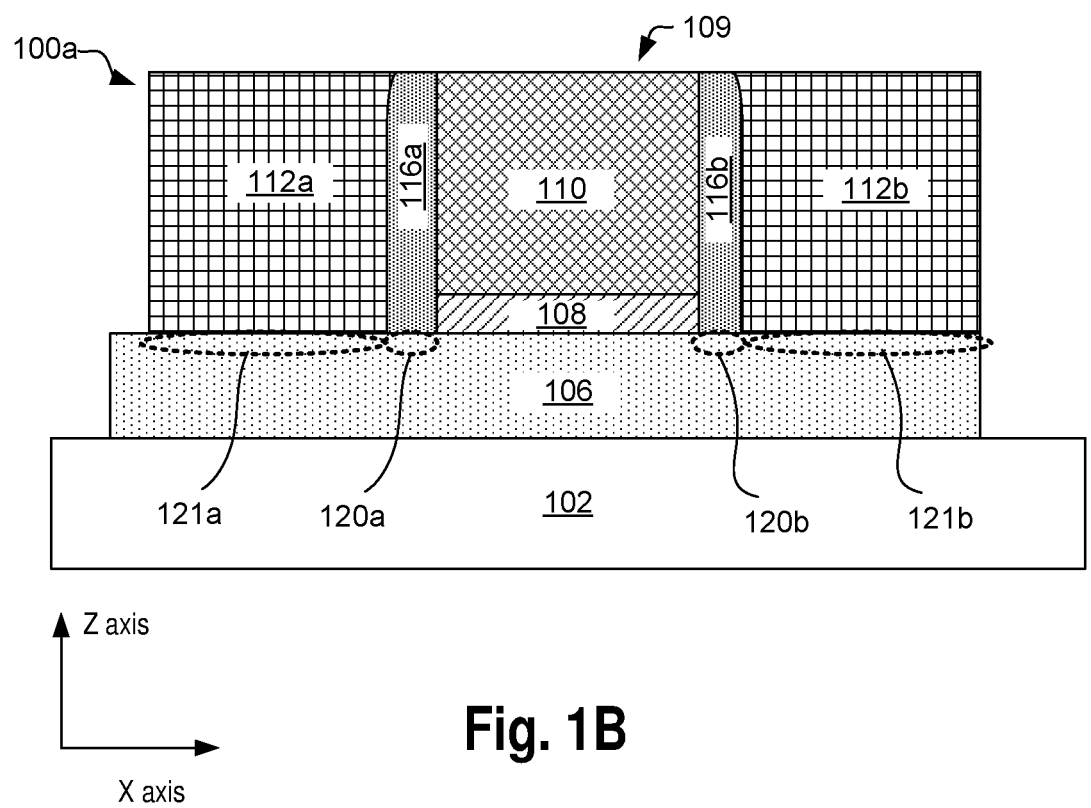
FIG. 1B illustrate a cross-sectional view of a TFT having a thin film that is selectively doped underneath one or more spacers and/or underneath one or more source/drain contacts, e.g., to decrease a contact resistance of the TFT, in accordance with some embodiments.

FIG. 1B illustrate a cross-sectional view of a TFT 100a having a thin film 106 that is selectively doped underneath one or more spacers 116a, 116b and/or underneath source/drain contacts 112, e.g., to decrease a contact resistance of the TFT 100a, in accordance with some embodiments. The TFT 100a of FIG. 1B is at least in part similar to the TFT 100 of FIG. 1A. However, in TFT 100a, sections 121a, 121b of the thin film 106 may also be doped, where the sections 121a, 121b of the thin film 106 may be underneath (e.g., directly underneath) the source/drain contacts 112a, 112b, respectively. For example, the sections 121a, 121b of the thin film 106 may be in direct contact with the source/drain contacts 112a, 112b.

In some embodiments, the dopants in the sections 121 may be similar to the dopants used in the sections 120 of the thin film 106 (although the dopants may be different in some other examples). In some embodiments, a doping concentration of the dopants in the sections 120 of thin film 106 may be relatively less than the doping concentration of the dopants in the sections 121 of thin film 106.

Thus, in the TFTs 100 and 100a of FIGS. 1A and 1B, respectively, sections of the thin film 106 underneath the spacers 116 and/or underneath the source/drain contacts 112 may be doped. The doping of selective sections of a top surface of the channel material of the thin film 106 may result in improved contacts resistance. In some embodiments, sections of the thin film 106 underneath the gate stack 109 may remain substantially un-doped, as illustrated in FIGS. 1A-1B. For example, sections of the thin film 106 in contact with the dielectric layer 108 may not be doped with the dopants.

Figure 2:
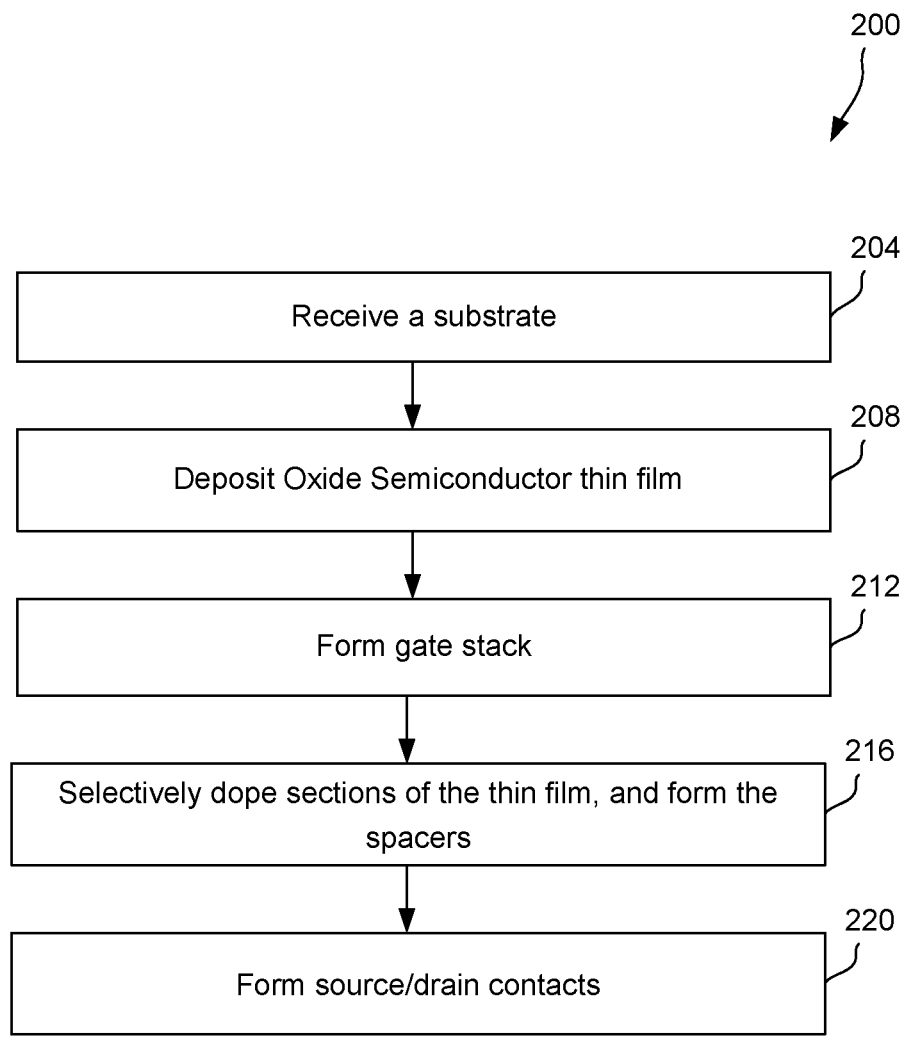
FIG. 2 illustrates a flow diagram illustrating exemplary methods for fabricating a TFT, according to some embodiments.

The TFTs 100, 100a described above may be fabricated on a substrate in a variety of manners. FIG. 2 illustrates a flow diagram illustrating exemplary methods 200 for fabricating a TFT, according to some embodiments. Methods 200 may be employed to fabricate TFTs 100, 100a of FIGS. 1A, 1B, for example. FIGS. 3A, 3B, 3C, 3D, and 3E illustrate cross-sectional views of a TFT that evolves as operations in methods 200 are practiced, according to some embodiments.

Referring to FIG. 2, methods 200 begin at operation 204, where a substrate is received. The substrate may have any architecture suitable for fabrication of a TFT cell, such as, but not limited to, substrate 102 introduced above, a display substrate, or similar.

An oxide semiconductor thin film is then deposited over a substrate layer at operation 208 of method 200. Any deposition process known to be suitable for a desired oxide semiconductor composition may be performed at operation 208, such as, but not limited to pulsed laser deposition (PLD), oxidation processing where a precursor is spin-coated and oxidized during an anneal, chemical vapor deposition (CVD), and atomic layer deposition (ALD). In the example further illustrated in FIG. 3A, a semiconductor thin film 110 (e.g., an amorphous oxide semiconductor thin film) is deposited on a substrate layer 102 that includes an amorphous dielectric layer.

Returning to FIG. 2, methods 200 continue at operation 212, where a gate stack is formed over a channel region of the oxide semiconductor thin film. The gate stack may be formed by any technique known to be suitable for a TFT. In exemplary embodiments further illustrated in FIG. 3B, gate dielectric 108, comprising any of the materials introduced above, is deposited over (e.g., in direct contact with) a channel region of semiconductor thin film 106. In some embodiments, an ALD process is employed to deposit a high-k gate dielectric film directly on a surface of semiconductor thin film 110. A gate electrode 110, comprising any of the materials introduced above, is deposited over (e.g., in direct contact with) gate dielectric 108. In some embodiments, gate electrode 110 is deposited by CVD, ALD, physical vapor deposition (PVD), or any other technique known to be suitable for forming the desired material. The gate stack 109 is then patterned, for example by masking and etching at least the gate electrode material layer.

Figure 3A:
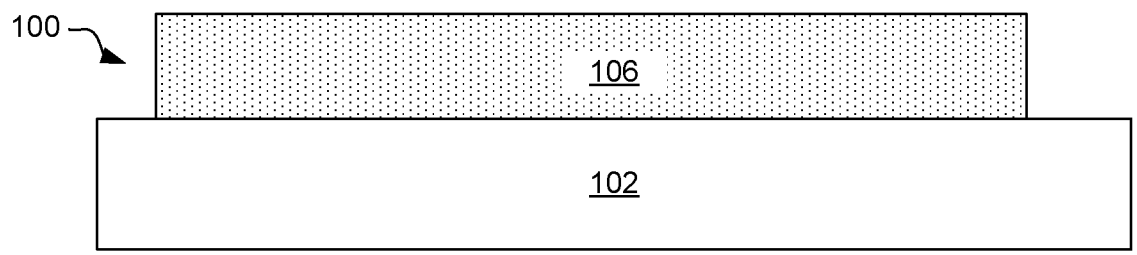
FIGS. 3A, 3B, 3C, 3D, and 3E illustrate cross-sectional views of a TFT that evolves as operations in methods of FIG. 2 are practiced, according to some embodiments.
Figure 3B:
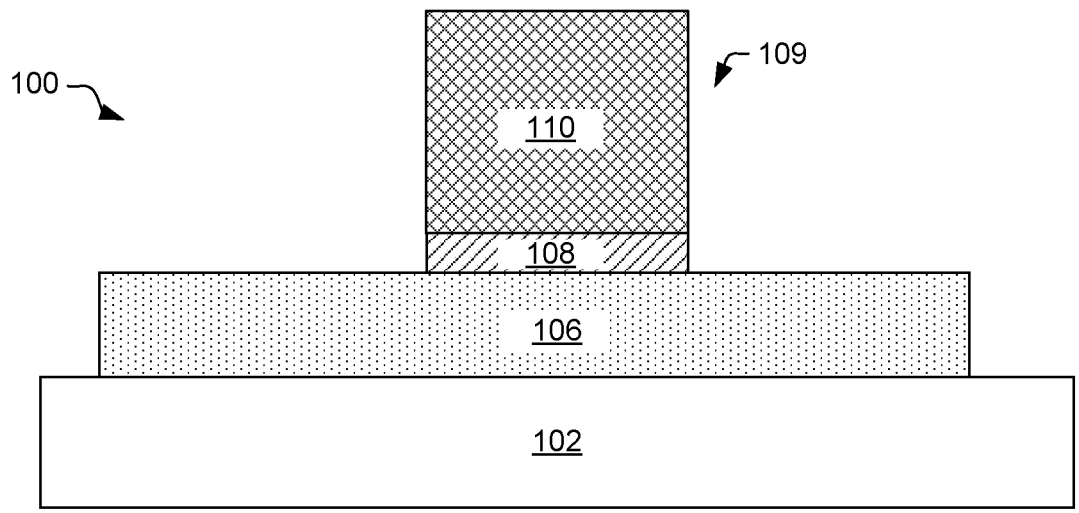
Figure 3C:
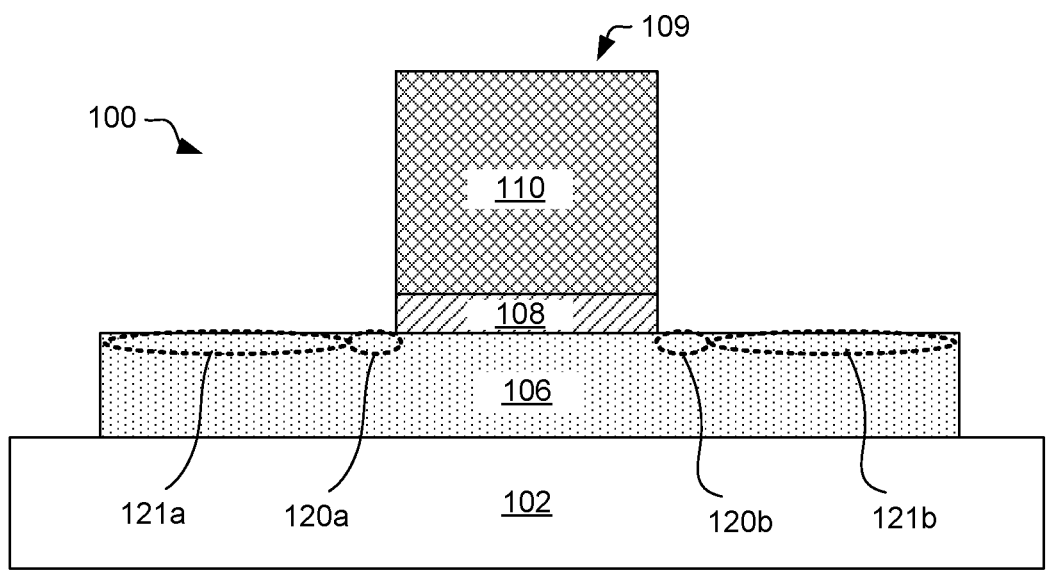

Returning to FIG. 2, methods 200 continue at operation 216, where sections of the thin film 106 (e.g., sections 120 and/or 121) are doped with appropriate dopants, and spacers adjoining the gate stack are formed. For example, FIG. 3C illustrates sections 120, 121 of the thin film 106 that may be doped with the dopants.

The thin film 106 may be doped by any appropriate doping technique. In an example, the doping may be directional, such that the sections 120, 121 of the thin film 106 are substantially doped, and the semiconductor thin film 106 underneath the gate stack 109 remains substantially undoped by the dopants.

In some embodiments, doping sections 120, 121 of the thin film 106 may involve creating oxygen vacancies in the metal oxide semiconductors of the sections 120, 121 of the thin film 106. Oxygen vacancies in the metal oxide semiconductors may be formed, for example, through defect formation. Defect formation may come from plasma chemistry and/or reduction-like chemistry, such as thin metals gettering oxygen. Any appropriate operations may be performed to dope the sections 120, 121, and/or to create oxygen vacancies in the metal oxide semiconductors of the sections 120, 121.

For example, sections 120, 121 of the thin film 106 may be exposed to plasma containing the dopants, which may introduce the dopants within the sections 120, 121 of the thin film. In another example, ion implantation may be used to dope the sections 120, 121 of the thin film 106, followed by annealing.

In yet another example, spin-on doping may be used to introduce dopants within the sections 120, 121 of the thin film 106. For example, while forming the spacers 116, spin-on dopant material may be introduced on the bottom layer of the spacers 116. In another example, spin-on dopant may be applied on the desired sections of the semiconductor thin film 110, and the spacers 116 may be formed on the spin-on dopant.

Subsequently, the spin-on dopant may be treated (e.g., via annealing, etc.) to introduce the dopants to the sections 120, 121 of the thin film 106. Thus, the formation of the spacers 116 and doping sections of the thin film 106 may be performed in a combined process in some examples.

In an example, doping of the sections 120 and 121 may be performed via a same or similar process, e.g., at least in part simultaneously. In an example, doping of the sections 120 may be performed separately and independently from doping of the sections 121. In an example, doping of one of the sections 120, 121 may be performed initially, and then doping of another of the sections 120, 121 may be performed. In an example, doping of the sections 120a and 121a may be performed via a same or similar process, and doping of the sections 120b and 121b may be performed via a same or similar process.

In an example, doping of the sections 120 may be performed (e.g., without doping sections 121), while in some other examples doping of the sections 121 may be performed (e.g., without doping sections 120). In such examples, sections of the thin film 106 may be doped underneath the spacers 116, or underneath the source/drain contacts 112.

Figure 3D:
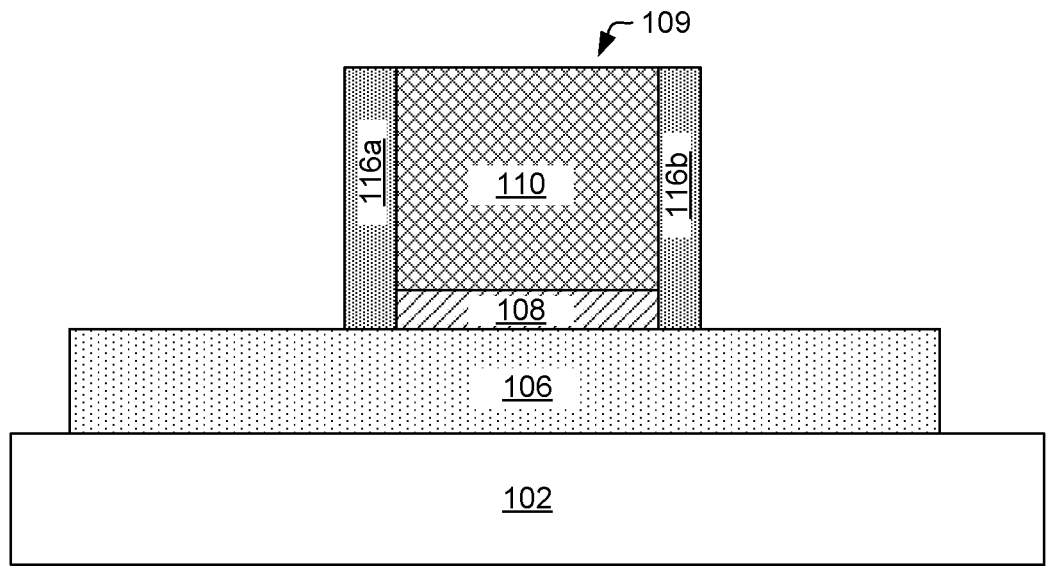
Figure 3E:
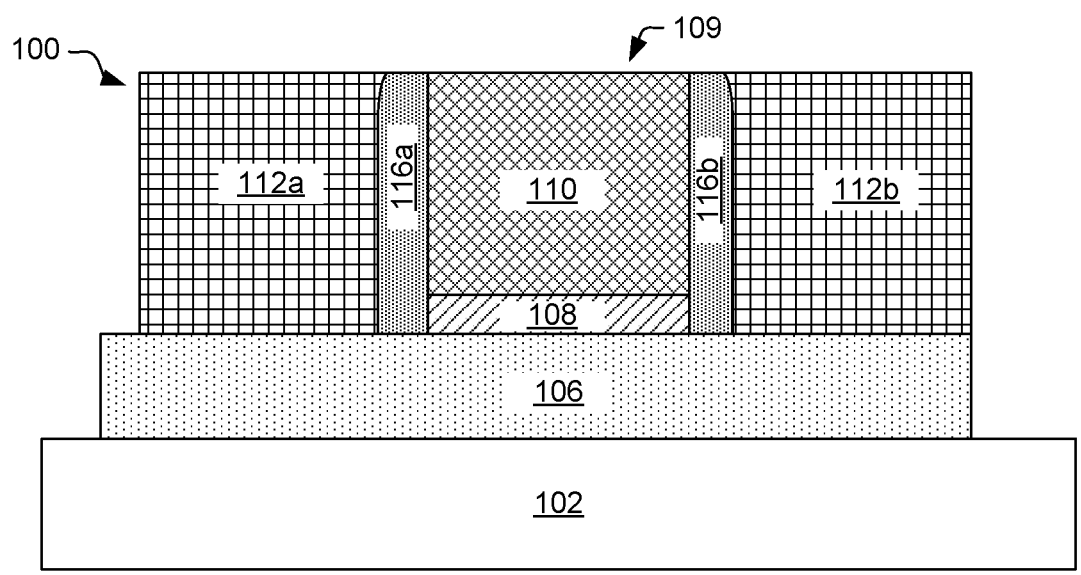

FIG. 3D illustrates the formation of the spacers 116. The spacers may be formed by any technique known to be suitable for a TFT. For example, a dielectric film may be deposited and recess etched with any suitable anisotropic etch process to form the spacers 116a, 116b along sidewalls of gate stack 109, e.g., as illustrated in FIG. 3C. Any gate dielectric 108 unmasked by the gate stack or gate sidewall spacers 116 may then be removed with any process (e.g., wet or dry etch) known to be suitable for the gate dielectric composition.

Returning to FIG. 2, methods 200 continue at operation 220, where source/drain contacts 112a, 112b are formed over the semiconductor thin film 106. Any deposition process known to be suitable for depositing a particular contact metallization composition may be performed at operation 220. In some embodiments, the deposition process induces order in the contact metallization. In the exemplary embodiment shown in FIG. 3E, contact metallization 112a, 112b are deposited in direct contact with portions of semiconductor thin film 110 not protected by gate stack 109 and the spacers 116. Contacts 112 may have any of the compositions described above. Contacts 112 may be deposited by a technique that favors the formation of grains at an interface with the semiconductor thin film 106. Contacts 112 may be deposited by a technique that favors columnar growth of grains formed at the interface of the semiconductor thin film 106. In some embodiments, PVD or ALD is employed to deposit a metal nitride (e.g., TiN) directly on semiconductor thin film 106. The resultant TFT illustrated in FIG. 3E may be the TFT 100 of FIG. 1A.

Figure 4:
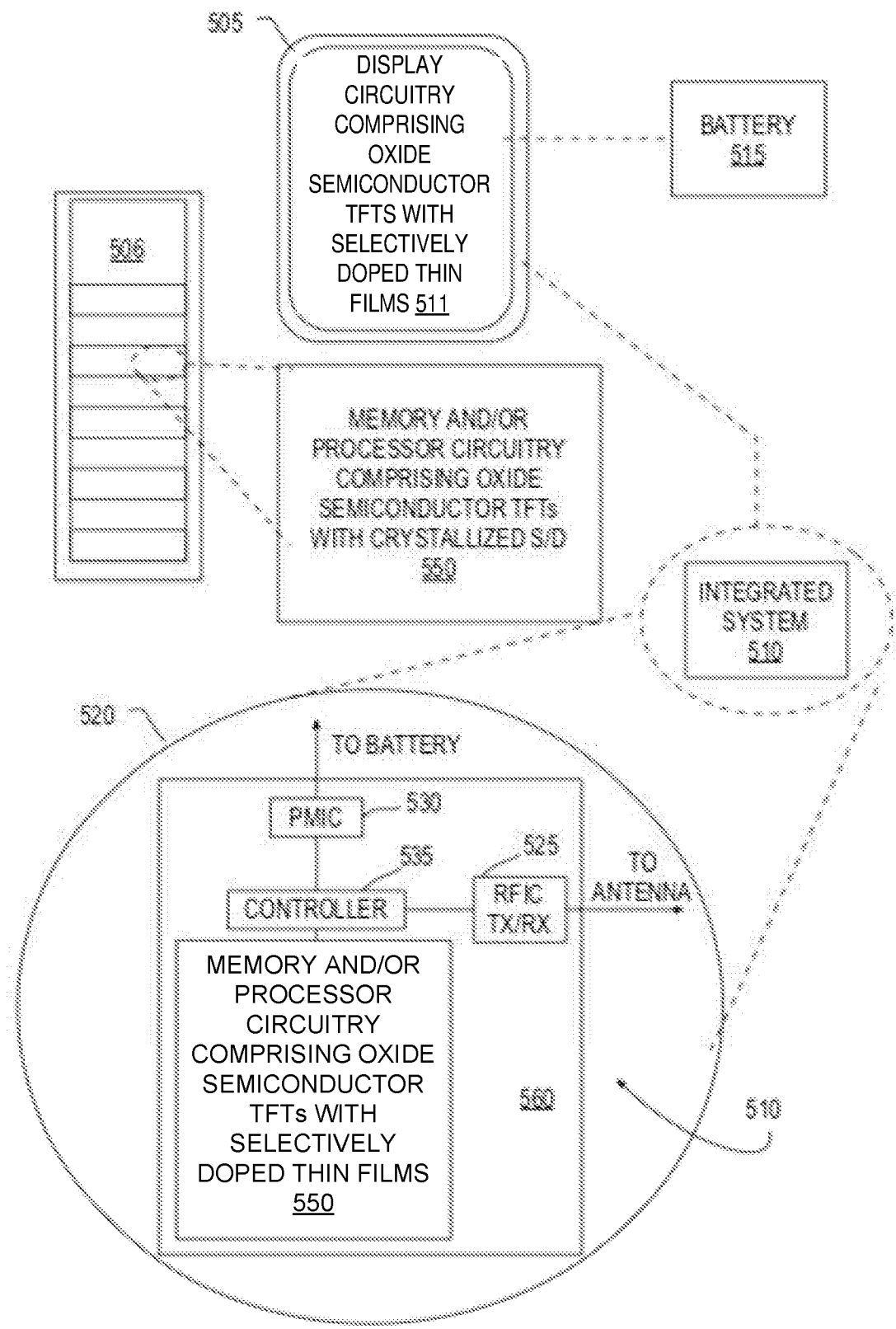
FIG. 4 illustrates a mobile computing platform and a data server machine employing an SoC including TFTs with selectively doped thin film, for example as described elsewhere herein, according to some embodiments.

FIG. 4 illustrates a mobile computing platform and a data server machine employing an SoC including TFTs with selectively doped thin film, for example as described elsewhere herein, according to some embodiments. The server machine 506 may be any commercial server, for example including any number of high-performance computing platforms within a rack and networked together for electronic data processing, which in the exemplary embodiment includes a packaged monolithic SoC 550. The mobile computing platform 505 may be any portable device configured for each of electronic data display, electronic data processing, wireless electronic data transmission, or the like. For example, the mobile computing platform 505 may be any of a tablet, a smart phone, laptop computer, etc., and may include a display screen (e.g., a capacitive, inductive, resistive, or optical touchscreen), a chip-level or package-level integrated system 510, and a battery 515.

Either within the integrated system 510 illustrated in the expanded view 520, or as a stand-alone packaged chip within the server machine 506, monolithic SoC 550 includes a memory block (e.g., RAM), a processor block (e.g., a microprocessor, a multi-core microprocessor, graphics processor, or the like) including at least one TFT with selectively doped spacers, for example as described elsewhere herein. The monolithic SoC 550 may be further coupled to a board, a substrate, or an interposer 560 along with, one or more of a power management integrated circuit (PMIC) 530, RF (wireless) integrated circuit (RFIC) 525 including a wideband RF (wireless) transmitter and/or receiver (TX/RX) (e.g., including a digital baseband and an analog front end module further comprises a power amplifier on a transmit path and a low noise amplifier on a receive path), and a controller 535. In some example, a display circuitry 511 may comprise at least one TFT with selectively doped spacers, for example as described elsewhere herein.

Functionally, PMIC 530 may perform battery power regulation, DC-to-DC conversion, etc., and so has an input coupled to battery 515 and with an output providing a current supply to other functional modules. As further illustrated, in the exemplary embodiment, RFIC 525 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G+, and beyond. In alternative implementations, each of these board-level modules may be integrated onto separate ICs or integrated into monolithic SoC 550.

Figure 5:
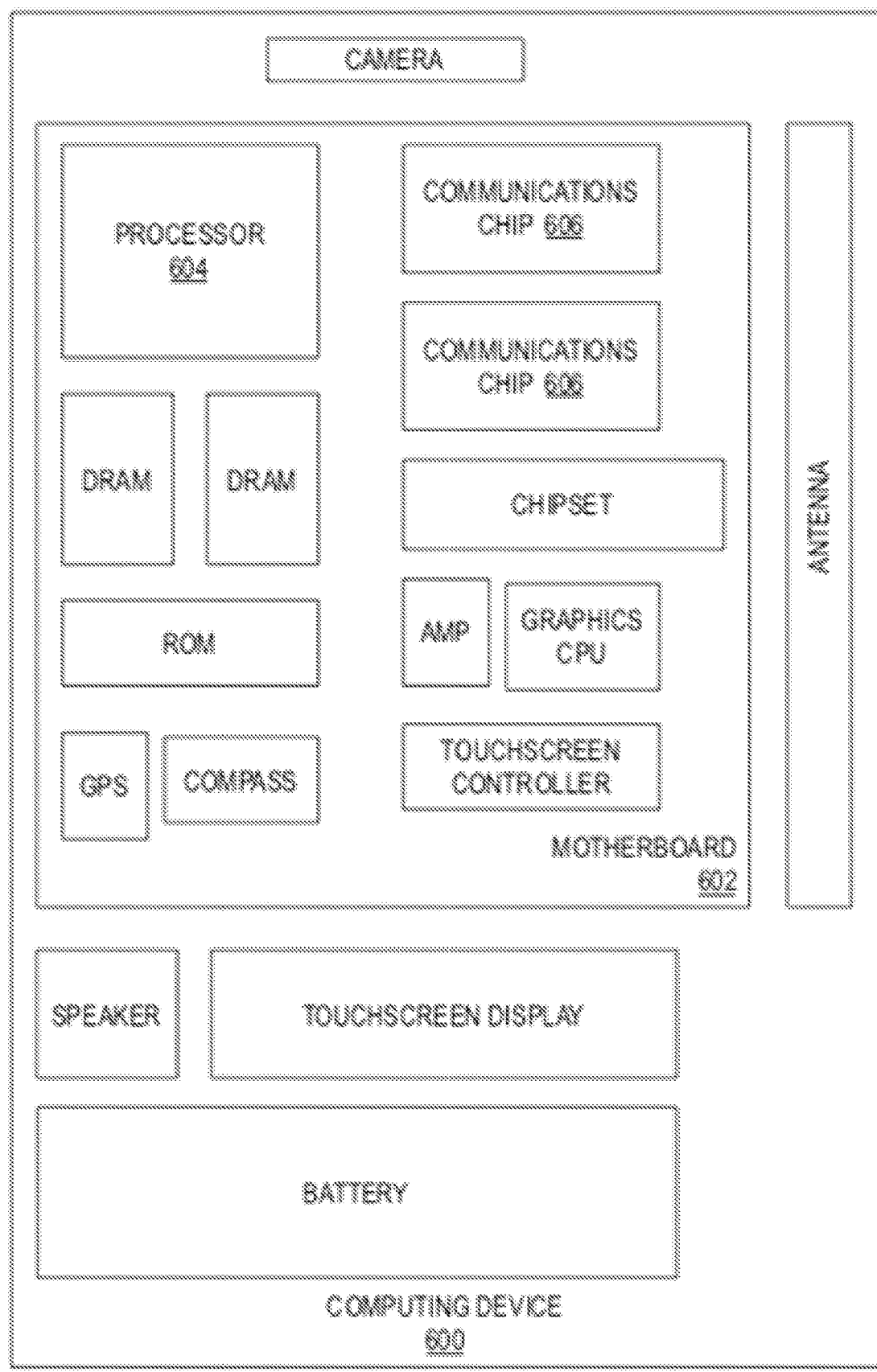
FIG. 5 illustrates a functional block diagram of an electronic computing device comprising TFTs with selectively doped thin film, according to some embodiments.

FIG. 5 illustrates a functional block diagram of an electronic computing device 600 comprising TFTs with selectively doped thin film, according to some embodiments. Computing device 600 may be found inside platform 505 or server machine 506, for example. Device 600 further includes a motherboard 602 hosting a number of components, such as, but not limited to, a processor 604 (e.g., an applications processor), which may further incorporate at least one TFT with selectively doped spacers, for example as described elsewhere herein. Processor 604 may be physically and/or electrically coupled to motherboard 602. In some examples, processor 604 includes an integrated circuit die packaged within the processor 604. In general, the term "processor" or "microprocessor" may refer to any device or portion of a device that processes electronic data from registers and/or memory to transform that electronic data into other electronic data that may be further stored in registers and/or memory.

In various examples, one or more communication chips 606 may also be physically and/or electrically coupled to the motherboard 602. In further implementations, communication chips 606 may be part of processor 604. Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 606 may enable wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 606 may implement any of a number of wireless standards or protocols, including but not limited to those described elsewhere herein. As discussed, computing device 600 may include a plurality of communication chips 606. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

We claim:

1. A thin film transistor (TFT) device comprising:
   a source and a drain;
   a gate stack comprising a gate dielectric structure and a gate electrode, the gate stack between the source and the drain;
   a semiconductor body comprising a metal oxide comprising oxygen and one or more of copper, zinc, tin, titanium, nickel, gallium, indium, antimony, strontium, chromium, cobalt, vanadium, or molybdenum, wherein a first section of the semiconductor body is adjacent to at least a section of the gate stack; and
   a spacer between the gate stack and the source, wherein the spacer is on the semiconductor body, and wherein at least a second section of the semiconductor body underneath the spacer comprises dopants comprising one or more of arsenic, phosphorous, or antimony and wherein the second section of the semiconductor body comprises oxygen vacancies therein.

2. The TFT device of claim 1, wherein the second section of the semiconductor body has more oxygen vacancies than the first section of the semiconductor body.

3. The TFT device of claim 1, wherein the second section of the semiconductor body is in direct contact with the spacer.

4. The TFT device of claim 1, wherein the spacer is a low-k material comprising one or more of silicon, oxygen, nitrogen, or carbon.

5. The TFT device of claim 1, wherein the gate dielectric structure comprises a high-K dielectric material comprising one or more of hafnium, silicon, zirconium, oxygen, aluminum, or nitrogen.

6. The TFT device of claim 1, wherein the spacer is a first spacer, and wherein the TFT device further comprises:
   a second spacer between the gate stack and the drain, wherein the second spacer is on the semiconductor body, and wherein at least a third section of the semiconductor body underneath the second spacer comprises dopants.

7. The TFT device of claim 1, wherein the gate dielectric structure is between the gate electrode and the first section of the semiconductor body.

8. The TFT device of claim 1, wherein the first section of the semiconductor body underneath the gate stack is substantially un-doped with the dopants and absent oxygen vacancies.

9. The TFT device of claim 1, wherein:
   a third section of the semiconductor body underneath the source comprises dopants; and
   a doping concentration of the dopants of the third section of the semiconductor body underneath the source is higher than a doping concentration of the dopants of the second section of the semiconductor body underneath the spacer.

10. The TFT device of claim 1, wherein:
    the TFT device is a top gate and top source/drain contact device;
    at least a portion of the gate electrode, at least a portion of the source, and at least a portion of the drain are coplanar; and at least a portion of the semiconductor body is to form a channel of the TFT device.

11. A system comprising:
a memory to store instructions;
a processor to execute the instructions: an integrated circuit (IC) coupled to the processor,
wherein the IC comprises a thin film transistor (TFT) comprising:
a gate stack,
a semiconductor structure comprising an oxide semiconductor, the oxide semiconductor comprising oxygen and one or more of copper, zinc, tin, titanium, nickel, gallium, indium, antimony, strontium, chromium, cobalt, vanadium, or molybdenum,
a contact metallization, and
a dielectric structure between the gate stack and the contact metallization, wherein a section of the semiconductor structure, which is directly underneath the dielectric structure, comprises dopants comprising one or more of arsenic, phosphorous, or antimony and wherein the section of the semiconductor body comprises oxygen vacancies therein; and
a wireless interface to allow the processor to communicate with another device.

12. The system of claim 11, wherein the dielectric structure comprises a low-k material including one or more of silicon, oxygen, nitrogen, or carbon.

13. The system of claim 11, wherein another section of the semiconductor structure, which is directly underneath the gate stack, is substantially un-doped.

14. The system of claim 11, wherein the contact metallization is a first contact metallization, the dielectric structure is a first dielectric structure, and wherein the TFT further comprises:
a second contact metallization; and
a second dielectric structure between the gate stack and the second contact metallization, wherein another section of the semiconductor structure, which is directly underneath the second dielectric structure, comprises the dopants and oxygen vacancies.

15. The system of claim 14, wherein the section of the semiconductor structure and the other section of the semiconductor structure are un-gated sections of the semiconductor structure.

16. A method of fabricating a thin film transistor (TFT) structure, the method comprising:
depositing a layer of semiconductor material comprising metal oxide semiconductor comprising oxygen and one or more of copper, zinc, tin, titanium, nickel, gallium, indium, antimony, strontium, chromium, cobalt, vanadium, or molybdenum;
forming a gate stack on the semiconductor material;
forming a first spacer and a second spacer on the semiconductor material, wherein the gate stack is between the first and second spacers;
doping at least a first section of the layer of semiconductor material that is in contact with the first spacer and at least a second section of the layer of semiconductor material that is in contact with the second spacer with dopants comprising one or more of arsenic, phosphorous, or antimony; and
creating oxygen vacancies in the first section of the layer of semiconductor material and the second section of the layer of semiconductor material.

17. The method of claim 16, further comprising:
forming a first source/drain contact adjacent to the first spacer and on the semiconductor material and a second source/drain contact adjacent to the second spacer and on the semiconductor material.

18. The method of claim 16, wherein doping at least the first section and the second section comprises:
doping, using one or both ion implantation or plasma, at least the first section and the second section.

* * * * *